(12) United States Patent
Huang et al.

(10) Patent No.: US 9,385,728 B2
(45) Date of Patent: Jul. 5, 2016

(54) INTEGRATED CLOCK DIFFERENTIAL BUFFERING

(71) Applicant: Intel Corporation, Santa Clara, CA (US)

(72) Inventors: Choupin Huang, San Jose, CA (US); Vijaya K. Boddu, Pleasanton, CA (US); Stefan Rusu, Santa Clara, CA (US); Nicholas B Peterson, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/513,024

(22) Filed: Oct. 13, 2014

(65) Prior Publication Data

US 2015/0188548 A1 Jul. 2, 2015

Related U.S. Application Data

(63) Continuation of application No. 13/929,164, filed on Jun. 27, 2013, now Pat. No. 8,860,479.

(60) Provisional application No. 61/799,748, filed on Mar. 15, 2013.

(51) Int. Cl.
*H03L 7/07* (2006.01)
*G06F 3/16* (2006.01)
(Continued)

(52) U.S. Cl.
CPC .......... *H03L 7/07* (2013.01); *G06F 3/167* (2013.01); *H03L 7/08* (2013.01); *H03L 7/0891* (2013.01); *H03L 2207/06* (2013.01)

(58) Field of Classification Search
CPC ............... H01L 2224/32145; H01L 2924/00; H01L 2924/00014; H03L 7/0891; H03L 7/07; H03L 7/18; H03L 7/0812; H03L 7/722; G11C 7/22; G11C 7/222; G11C 7/1072; G11C 7/1057; G11C 7/109
USPC .......................................... 327/156, 158, 161
See application file for complete search history.

(56) References Cited

U.S. PATENT DOCUMENTS 6,483,360 B2 11/2002 Nakamura
7,098,685 B1 8/2006 Agrawal et al.
(Continued)

FOREIGN PATENT DOCUMENTS

| JP | 2001-016077 | 1/2001 |
| KR | 10-2006-0067189 | 6/2006 |
| WO | WO 2014/149438 | 9/2014 |

OTHER PUBLICATIONS

PCT International Search Report and Written Opinion in PCT International Application Serial No. PCT/US2014/018432 mailed on 05-27-201.
(Continued)

*Primary Examiner* — John Poos
(74) *Attorney, Agent, or Firm* — Patent Capital Group

(57) ABSTRACT

Integrated clock differential buffering. A first phase locked loop (PLL) circuit having a first clocking ratio is coupled to receive an input differential clock signal. The first PLL circuit generates a first reference clock signal. A second PLL circuit having a second clocking ratio is coupled to receive the input differential clock signal. The second PLL circuit to generate a second reference clock signal. A first set of clock signal output buffers are coupled to receive the first reference clock signal and to provide a first differential reference clock signal corresponding to the first reference clock signal. A second set of clock signal output buffers is coupled to receive the second reference clock signal and to provide a second differential reference clock signal corresponding to the second reference clock signal. The first PLL circuit, the second PLL circuit, the first set of output buffers and the second set of output buffers reside within an integrated circuit package also having a die to receive at least the first differential reference clock signal.

18 Claims, 10 Drawing Sheets

(51) Int. Cl.
*H03L 7/089* (2006.01)
*H03L 7/08* (2006.01)

(56) References Cited

U.S. PATENT DOCUMENTS

| | | | |
|---|---|---|---|
| 7,821,343 | B1 | 10/2010 | Wong et al. |
| 8,860,479 | B2 | 10/2014 | Huang et al. |
| 2005/0088429 | A1* | 4/2005 | Cheng ............... H04L 25/0272 345/204 |
| 2005/0218955 | A1 | 10/2005 | Kurd et al. |
| 2014/0266340 | A1 | 9/2014 | Huang et al. |

OTHER PUBLICATIONS

Notice of Allowance in U.S. Appl. No. 13/929,164 mailed on Jun. 10, 2014.
PCT International Preliminary Report on Patentability in PCT Application Serial No. PCT/US2014/018432 mailed on Sep. 15, 2015.

* cited by examiner

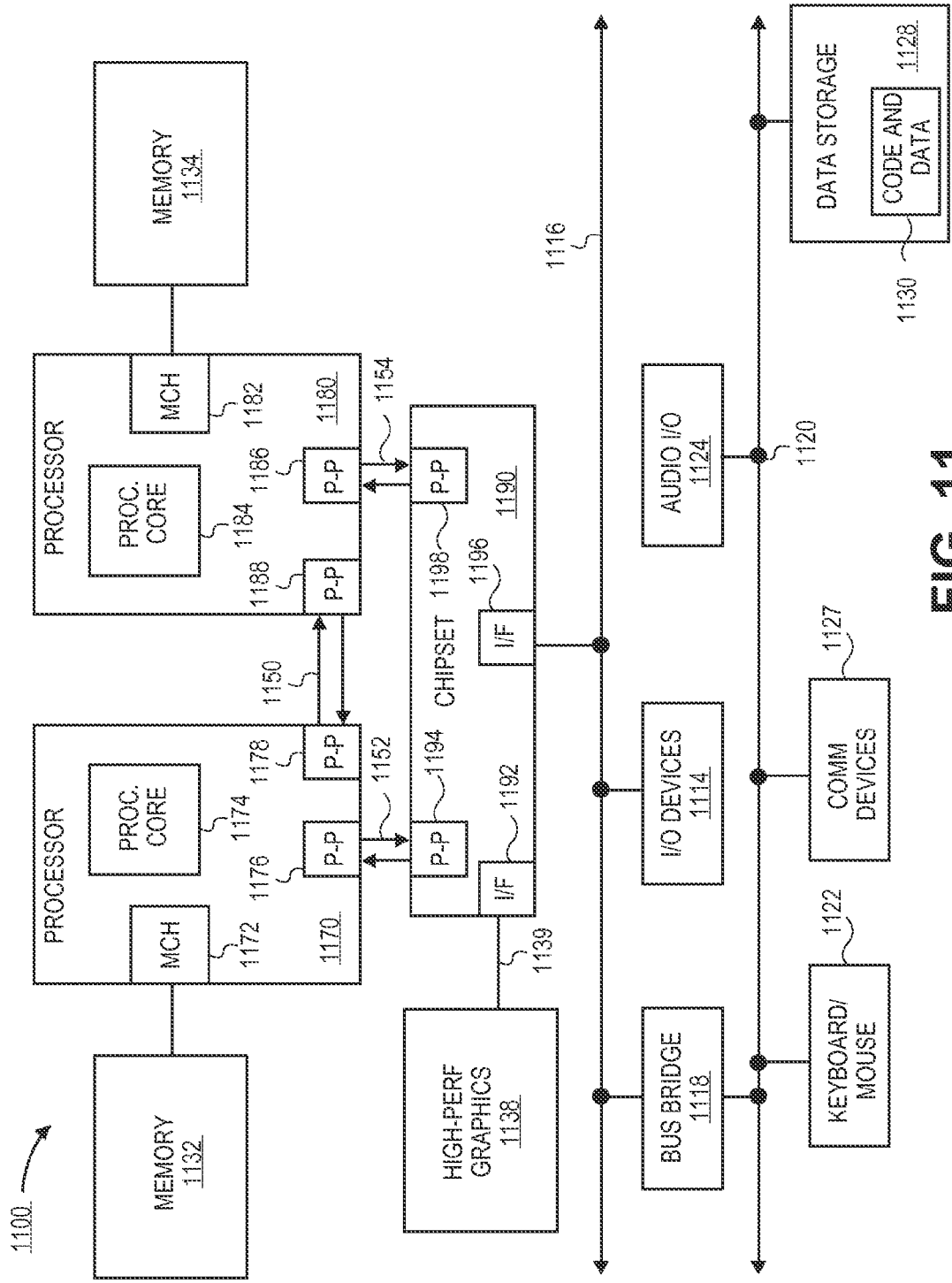

INTEGRATED CLOCK DIFFERENTIAL BUFFERING

PRIORITY

This application claims priority to U.S. Provisional Patent Application No. 61/799,748, entitled "CLOCK DIFFERENTIAL BUFFERING" by Choupin Huang, Vijaya K. Boddu, Stephan Rusu and Nicholas B. Peterson, filed Mar. 15, 2013.

TECHNICAL FIELD

Embodiments of the invention relate to techniques for clock signal buffering. More particularly, embodiments of the invention relate to techniques for providing clock signals to highly integrated circuits.

BACKGROUND

With increasing integration and/or increasing input/output (I/O) needs, the number of reference clock signal entries to a processor die increases. One approach is to provide additional external clock signals, but with differential clock signals and increasing reference clock needs, the number of pins and increased routing complexity may quickly become impractical.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 11 illustrates another embodiment of a block diagram for a computing system.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is a fully integrated clock differential buffer (FICDB) that can be used to provide a reference clock signal to, for example, high-speed (I/O) interconnects, processing cores, memories, etc. In one embodiment, the reference clock differential pair from the FICDB is supplied to each die entry to provide a high quality reference clock for high-speed serial links. This can also reduce performance risks associated with other clock distribution techniques. In one embodiment, the FICDB can provide an effective solution with well controlled reference clock drift (or differential jitter) because only one reference clock differential pair travels from the clock source to the chip socket.

In one embodiment, the FICDB can be either a flat package part with, for example, a micro ball grid array package or a bare die that can be flip chip mounted on a processing core substrate. In one embodiment, LC phase locked loop (PLL) output differential buffers (that can have individual output enabling control), an input clock pair, control circuitry (e.g., supporting PWRGD#/PWRGD). In one embodiment, adaptive PLL bandwidth is utilized. In one embodiment, control logic is coupled with a processing core except for the power good signals (e.g., supporting PWRGD#/PWRGD). In one embodiment, all digital and analog power supplies for the FICDB are supplied from the same power supply.

Figure 1:
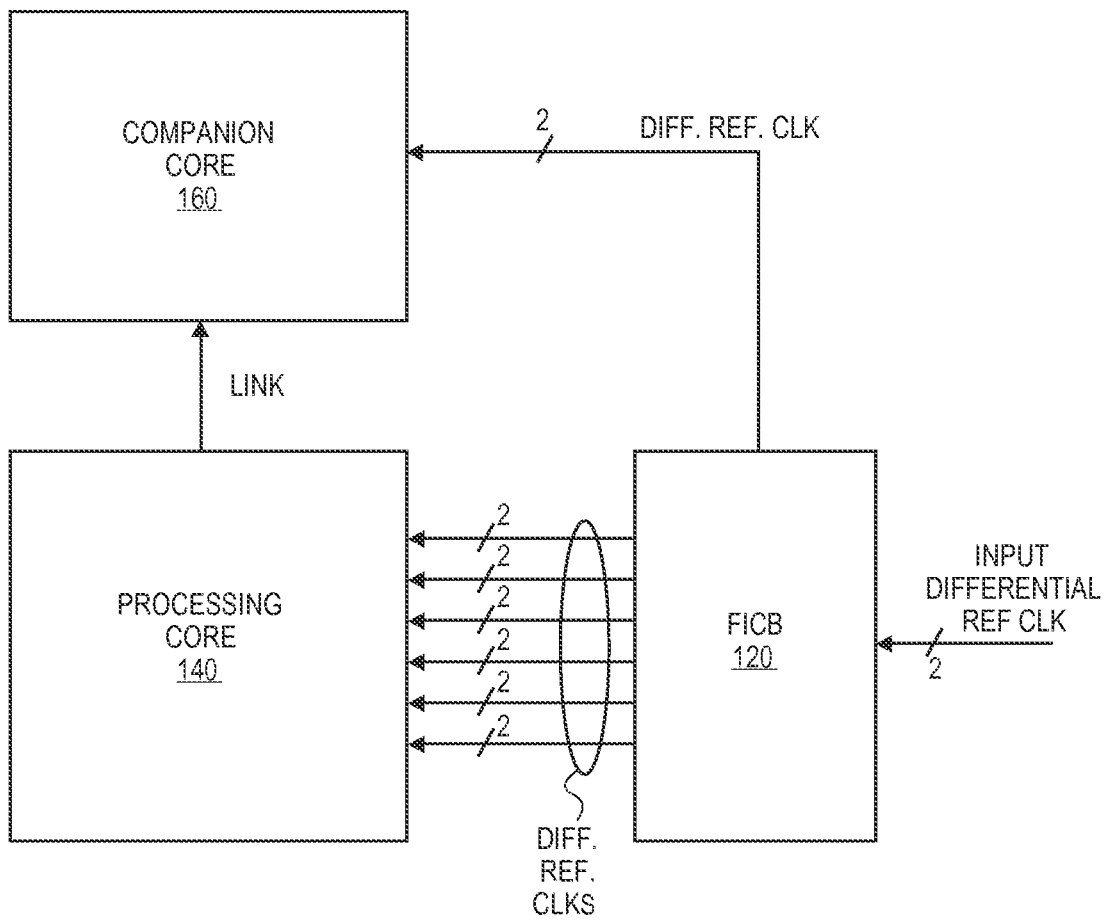
FIG. 1 is a block diagram of one embodiment of a processor clocking solution utilizing a fully integrated clock differential buffer (FICDB).

FIG. 1 is a block diagram of one embodiment of a processor clocking solution utilizing a fully integrated clock differential buffer (FICDB). The example of FIG. 1 illustrates a single processing core die and a companion die, which can be any type of die coupled with the processing core. The example of FIG. 1 is simplified to illustrate the operation of the FICDB and any number of dies can be supported using the techniques described herein.

Package 100 can receive an input differential clock signal from an external source (not illustrated in FIG. 1). This differential clock source can be any type known in the art and may be supplied to internal components (e.g., processing core, memory, control logic) through pins or any type of external connector. The input differential clock signal can be any frequency (e.g., 100 MHz, 200 MHz, 50 MHz) FICDB 120 receives the input differential clock signal.

In one embodiment, FICDB 120 receives the input differential clock signal and provides multiple reference differential clock pairs to processing die 140 and/or companion die 160. The reference differential clock pairs provided by FICDB 120 can be the same frequency as the input differential clock signal and/or multiples (whole and/or fractional) of the input differential clock signal. One embodiment of FICDB 120 is provided in greater detail below in FIG. 2.

With this configuration, FICDB 120 provides a robust reference clock solution for processing cores and/or other components requiring significant numbers of reference clock entry points in order to support, for example, high-speed I/O links and bandwidth. FICDB 120 also delivers the reference clock signals also have better controlled drift between clock pairs to the processing cores and/or other components than existing solutions that rely on length matching and other solutions.

Processing core 140 is designed for any number of reference clock pairs that can be provided by FICDB 120. The example of FIG. 1 illustrates six reference clock pairs, but any number can be supported. Also, while the example of FIG. 1 includes processing core 140, any other integrated component utilizing reference clock pairs (e.g., system on chip, processor, multiple processors, interconnect controller, system control logic) can be supported in a similar manner.

In one embodiment, FICDB 120 also provides a reference clock pair to companion die 160, which can be any type of companion die that operates with processing core 140. For example, companion die 160 can be memory, cache memory, a co-processor, a secure processor, a network interface, bridging circuitry, etc. In one embodiment, on die link 150 provides a link between processing core 140 and companion die 160 and can utilize the reference clock signals provided by FICDB 120. One or more of the components of FIG. 1 can be replicated within a single package.

Figure 2:
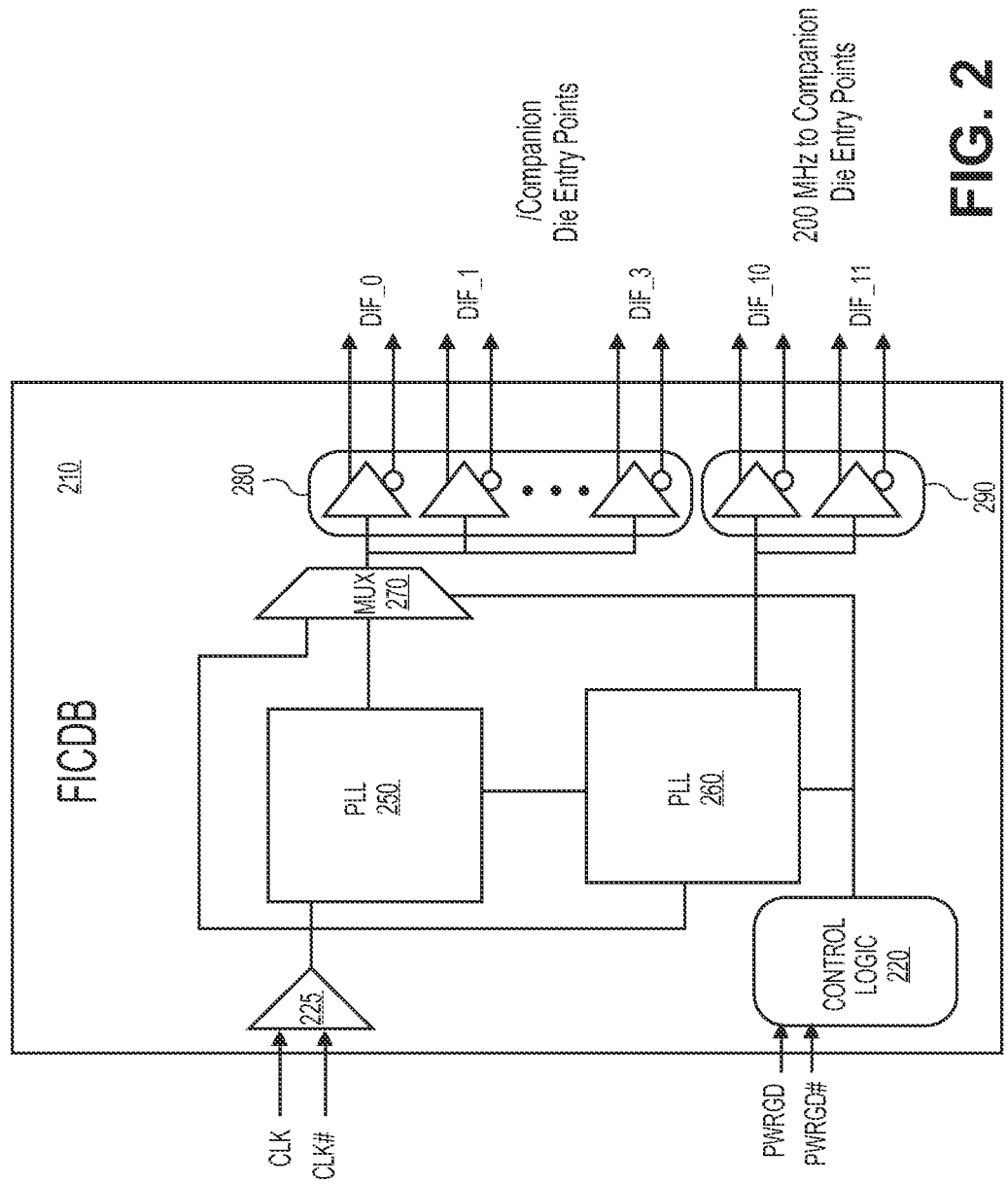
FIG. 2 is a block diagram of one embodiment of a fully integrated clock differential buffer (FICDB).

FIG. 2 is a block diagram of one embodiment of a fully integrated clock differential buffer (FICDB). The example of FIG. 2 includes a limited number of PLLs; however, any number of PLLs can be supported and any number of differential reference clock signals can be provided.

In one embodiment, FICDB 210 includes control logic 220 and any number of PLLs (e.g. 250, 260). Control logic 220 receives external signals related to the input differential clock signal received from an external source (not illustrated in FIG. 2). In one embodiment, the input differential clock signal (e.g., CLK and CLK#) are buffered by buffer 225.

Control logic 220 can receive one or more control signals indicating the state of the input differential clock signal. These control signals can include, for example, one or more of signals indicating the power supply is providing sufficient operational voltage (e.g., PWRGD, PWRGD#), adaptive bandwidth signal(s), SDA and/or SCL. In one embodiment, the control signals are received from a processing core; however, the control signals can also be received from other sources.

The PLLs (e.g., 250, 260) receive the input differential clock signal and generate an output signal that synchronized with the input differential clock signal. In one embodiment, the PLLs (e.g., 250, 260) are Serial Synchronous Controller (SSC) compatible devices. The PLLs can provide different ratios, for example, PLL 250 can be a 1:1 PLL while PLL 260 can be a 1:2 PLL. Other and/or more ratios can also be supported.

In one embodiment, control logic 220 controls PLL 250, PLL 260 and multiplexor 270. Multiplexor 270 operates to select between the input differential clock signal and the output signal from a 1:1 multiplexor (e.g., 250). The output signal from multiplexor 270 provides an input signal to any number of output buffers, 280, that provide differential clock signals. Similarly, the output signal from PLL 260 provides an input signal to any number of output buffers, 290, that provide differential clock signals at the ratio of PLL 260 (e.g., 2:1).

In one embodiment, each clock entry point for a die (not illustrated in FIG. 2) has a corresponding output buffer (e.g., 280, 290) in FICDB 210. Returning to the example of FIG. 1, for each clock entry point for processing core 140 and companion die 160, there is a corresponding output buffer in FICDB 210.

Figure 3A:
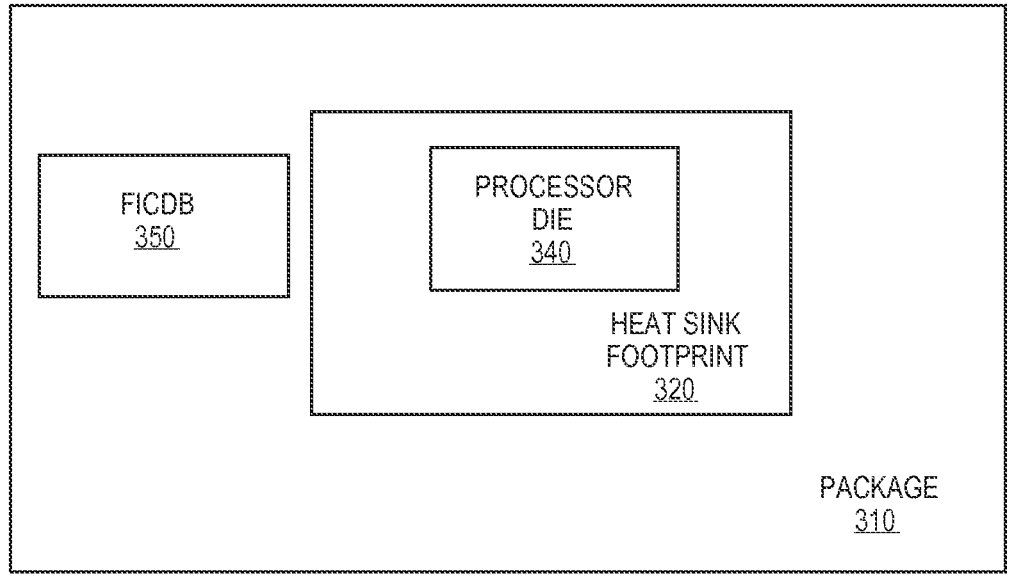
FIG. 3A is a conceptual illustration of a FICDB within an integrated circuit package outside of a heat sink footprint.

FIG. 3A is a conceptual illustration of a FICDB within an integrated circuit package outside of a heat sink footprint. In the example of FIG. 3A, processor core 340 is disposed within package 310. While one processor core is illustrated, any number of processing cores and/or FICDBs can be similarly included.

In the example of FIG. 3A, processor core 340 is located beneath an integrated heat sink (the footprint of which is illustrated by 320). In one embodiment, FICDB 350 resides outside of the integrated heat sink footprint.

Figure 3B:
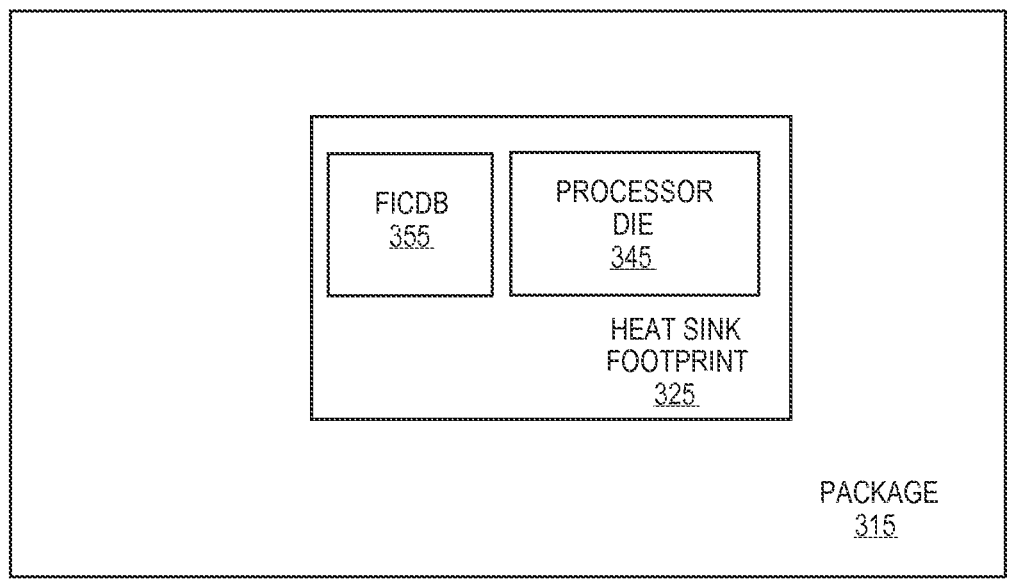
FIG. 3B is a conceptual illustration of a FICDB within an integrated circuit package within a heat sink footprint.

FIG. 3B is a conceptual illustration of a FICDB within an integrated circuit package within a heat sink footprint. In the example of FIG. 3B, processor core 345 is disposed within package 315. While one processor core is illustrated, any number of processing cores and/or FICDBs can be similarly included.

In the example of FIG. 3B, processor core 345 is located beneath an integrated heat sink (the footprint of which is illustrated by 325). In one embodiment, FICDB 355 also resides within the integrated heat sink footprint.

Figure 4:
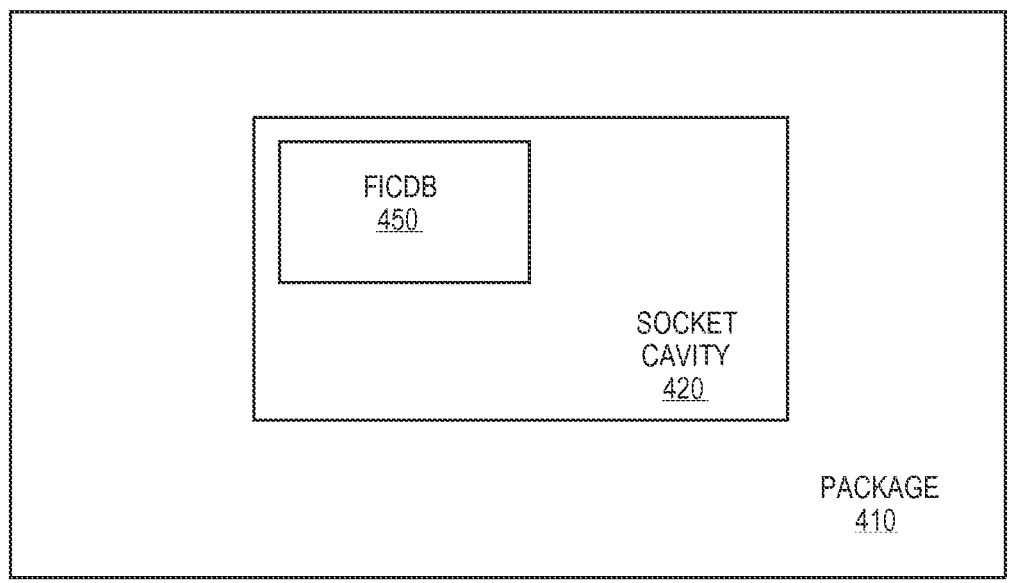
FIG. 4 is a conceptual illustration of a FICDB within an integrated circuit package within a socket cavity.

FIG. 4 is a conceptual illustration of a FICDB within an integrated circuit package within a heat sink footprint. In the example of FIG. 4, FICDB 450 is located beneath an integrated heat sink (the footprint of which is illustrated by 420). In one embodiment, FICDB 350 resides within the integrated heat sink footprint.

In one embodiment, the FICDBs as described herein are utilized to provide clock signals to circuitry including high-speed serial input/output (I/O) interfaces. For example, these interface can be Peripheral Component Interconnect (PCI) and/or PCI Express (PCIe) interfaces. Other link protocols can be similarly supported. One or more of the components of the systems described below can be implemented on one or more integrated circuit dies within a package that receives a reference clock signal from a FICDB as described herein.

A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms.

Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 5:
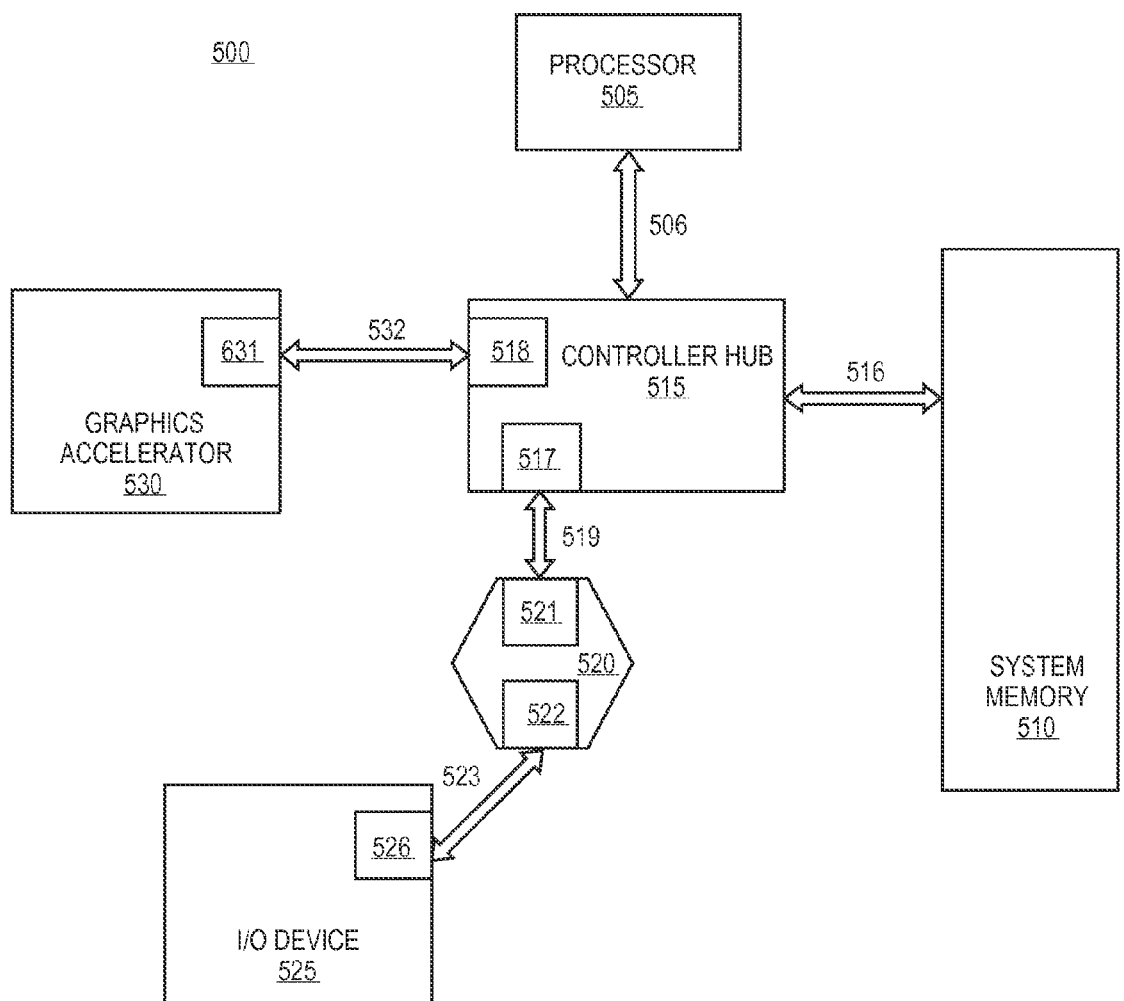
FIG. 5 illustrates an embodiment of a computing system including an a peripheral component interconnect express (PCIe) compliant architecture.

Referring to FIG. 5, an embodiment of a fabric composed of point-to-point Links that interconnect a set of components is illustrated. System 500 includes processor 505 and system memory 510 coupled to controller hub 515. Processor 505 includes any processing element, such as a microprocessor, a host processor, an embedded processor, a co-processor, or other processor. Processor 505 is coupled to controller hub 515 through front-side bus (FSB) 506. In one embodiment, FSB 506 is a serial point-to-point interconnect as described below. In another embodiment, link 506 includes a serial, differential interconnect architecture that is compliant with different interconnect standard.

System memory 510 includes any memory device, such as random access memory (RAM), non-volatile (NV) memory, or other memory accessible by devices in system 500. System memory 510 is coupled to controller hub 515 through memory interface 516. Examples of a memory interface include a double-data rate (DDR) memory interface, a dual-channel DDR memory interface, and a dynamic RAM (DRAM) memory interface.

In one embodiment, controller hub 515 is a root hub, root complex, or root controller in a Peripheral Component Interconnect Express (PCIe or PCIE) interconnection hierarchy.

Examples of controller hub 515 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 505, while controller 515 is to communicate with I/O devices, in a similar manner as described below. In some embodiments, peer-to-peer routing is optionally supported through root complex 515.

Here, controller hub 515 is coupled to switch/bridge 520 through serial link 519. Input/output modules 517 and 521, which may also be referred to as interfaces/ports 517 and 521, include/implement a layered protocol stack to provide communication between controller hub 515 and switch 520. In one embodiment, multiple devices are capable of being coupled to switch 520.

Switch/bridge 520 routes packets/messages from device 525 upstream, i.e. up a hierarchy towards a root complex, to controller hub 515 and downstream, i.e. down a hierarchy away from a root controller, from processor 505 or system memory 510 to device 525. Switch 520, in one embodiment, is referred to as a logical assembly of multiple virtual PCI-to-PCI bridge devices. Device 525 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 525 may include a PCIe to PCI/PCI-X bridge to support legacy or other version PCI devices. Endpoint devices in PCIe are often classified as legacy, PCIe, or root complex integrated endpoints.

Graphics accelerator 530 is also coupled to controller hub 515 through serial link 532. In one embodiment, graphics accelerator 530 is coupled to an MCH, which is coupled to an ICH. Switch 520, and accordingly I/O device 525, is then coupled to the ICH. I/O modules 531 and 518 are also to implement a layered protocol stack to communicate between graphics accelerator 530 and controller hub 515. Similar to the MCH discussion above, a graphics controller or the graphics accelerator 530 itself may be integrated in processor 505.

Figure 6:
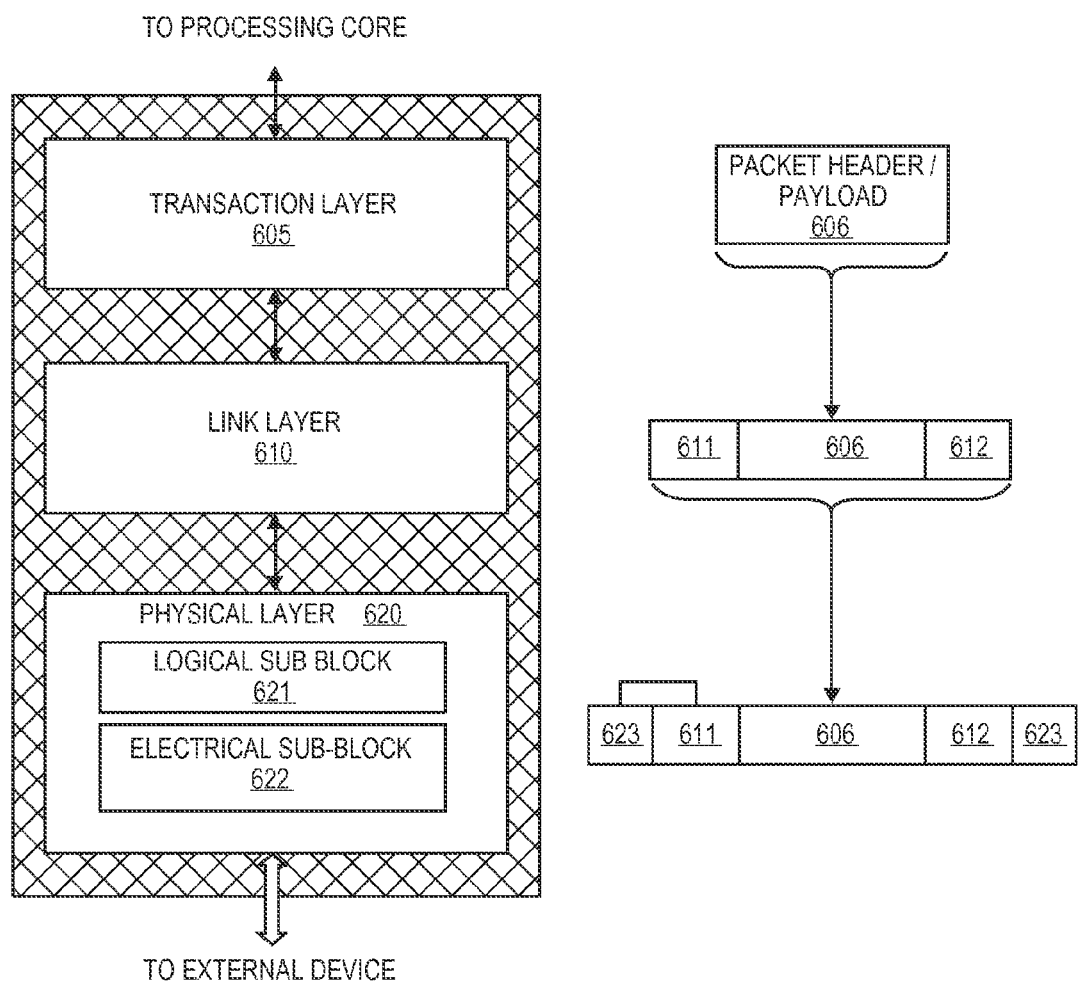
FIG. 6 illustrates an embodiment of a PCIe compliant interconnect architecture including a layered stack.

Turning to FIG. 6 an embodiment of a layered protocol stack is illustrated. Layered protocol stack 600 includes any form of a layered communication stack, such as a Quick Path Interconnect (QPI) stack, a PCie stack, a next generation high performance computing interconnect stack, or other layered stack. Although the discussion immediately below is in relation to a PCIe stack, the same concepts may be applied to other interconnect stacks. In one embodiment, protocol stack 600 is a PCIe protocol stack including transaction layer 605, link layer 610, and physical layer 620. Representation as a communication protocol stack may also be referred to as a module or interface implementing/including a protocol stack.

PCI Express uses packets to communicate information between components. Packets are formed in the Transaction Layer 605 and Data Link Layer 610 to carry the information from the transmitting component to the receiving component. As the transmitted packets flow through the other layers, they are extended with additional information necessary to handle packets at those layers. At the receiving side the reverse process occurs and packets get transformed from their Physical Layer 620 representation to the Data Link Layer 610 representation and finally (for Transaction Layer Packets) to the form that can be processed by the Transaction Layer 605 of the receiving device.

In one embodiment, transaction layer 605 is to provide an interface between a device's processing core and the interconnect architecture, such as data link layer 610 and physical layer 620. In this regard, a primary responsibility of the transaction layer 605 is the assembly and disassembly of packets (i.e., transaction layer packets, or TLPs). The translation layer 605 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 605. An external device at the opposite end of the link, such as a controller hub, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 605 assembles packet header/payload 606. Format for current packet headers/payloads may be found in the PCIe specification at the PCIe specification website.

Figure 7:
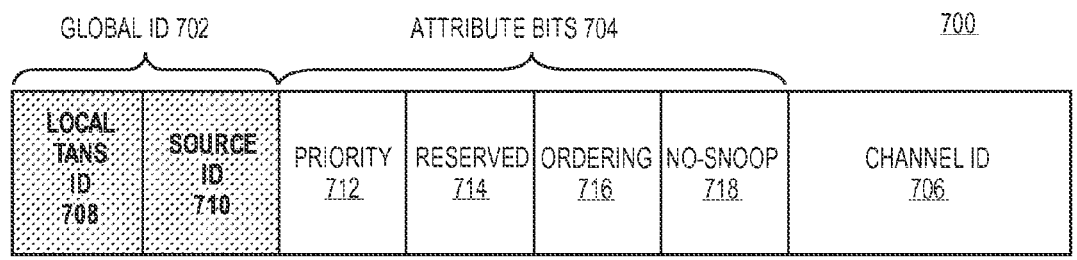
FIG. 7 illustrates an embodiment of a PCIe compliant request or packet to be generated or received within an interconnect architecture.

Quickly referring to FIG. 7, an embodiment of a PCIe transaction descriptor is illustrated. In one embodiment, transaction descriptor 700 is a mechanism for carrying transaction information. In this regard, transaction descriptor 700 supports identification of transactions in a system. Other potential uses include tracking modifications of default transaction ordering and association of transaction with channels.

Transaction descriptor 700 includes global identifier field 702, attributes field 704 and channel identifier field 706. In the illustrated example, global identifier field 702 is depicted comprising local transaction identifier field 708 and source identifier field 710. In one embodiment, global transaction identifier 702 is unique for all outstanding requests.

According to one implementation, local transaction identifier field 708 is a field generated by a requesting agent, and it is unique for all outstanding requests that require a completion for that requesting agent. Furthermore, in this example, source identifier 710 uniquely identifies the requestor agent within a PCIe hierarchy. Accordingly, together with source ID 710, local transaction identifier 708 field provides global identification of a transaction within a hierarchy domain.

Attributes field 704 specifies characteristics and relationships of the transaction. In this regard, attributes field 704 is potentially used to provide additional information that allows modification of the default handling of transactions. In one embodiment, attributes field 704 includes priority field 712, reserved field 714, ordering field 716, and no-snoop field 718. Here, priority sub-field 712 may be modified by an initiator to assign a priority to the transaction. Reserved attribute field 714 is left reserved for future, or vendor-defined usage. Possible usage models using priority or security attributes may be implemented using the reserved attribute field.

In this example, ordering attribute field 716 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 718 is utilized to determine if transactions are snooped. As shown, channel ID Field 706 identifies a channel that a transaction is associated with.

Link layer 610, also referred to as data link layer 610, acts as an intermediate stage between transaction layer 605 and the physical layer 620. In one embodiment, a responsibility of the data link layer 610 is providing a reliable mechanism for exchanging Transaction Layer Packets (TLPs) between two components a link. One side of the Data Link Layer 610 accepts TLPs assembled by the Transaction Layer 605, applies packet sequence identifier 611, i.e. an identification number or packet number, calculates and applies an error detection code, i.e. CRC 612, and submits the modified TLPs to the Physical Layer 620 for transmission across a physical to an external device.

In one embodiment, physical layer 620 includes logical sub block 621 and electrical sub-block 622 to physically transmit a packet to an external device. Here, logical sub-block 621 is responsible for the "digital" functions of Physical Layer 621. In this regard, the logical sub-block includes a transmit section to prepare outgoing information for transmission by physical sub-block 622, and a receiver section to identify and prepare received information before passing it to the Link Layer 610.

Physical block 622 includes a transmitter and a receiver. The transmitter is supplied by logical sub-block 621 with symbols, which the transmitter serializes and transmits onto to an external device. The receiver is supplied with serialized symbols from an external device and transforms the received signals into a bit-stream. The bit-stream is de-serialized and supplied to logical sub-block 621. In one embodiment, an 8b/10b transmission code is employed, where ten-bit symbols are transmitted/received. Here, special symbols are used to frame a packet with frames 623. In addition, in one example, the receiver also provides a symbol clock recovered from the incoming serial stream.

As stated above, although transaction layer 605, link layer 610, and physical layer 620 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 8:
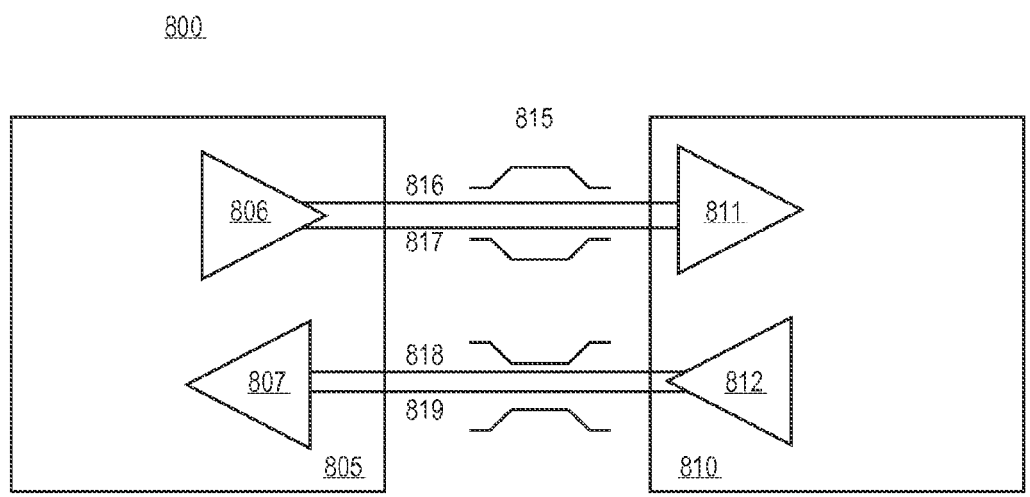
FIG. 8 illustrates an embodiment of a transmitter and receiver pair for a PCIe compliant interconnect architecture.

Referring next to FIG. 8, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 806/811 and a receive pair 812/807. Accordingly, device 805 includes transmission logic 806 to transmit data to device 810 and receiving logic 807 to receive data from device 810. In other words, two transmitting paths, i.e. paths 816 and 817, and two receiving paths, i.e. paths 818 and 819, are included in a PCIe link.

A transmission path refers to any path for transmitting data, such as a transmission line, a copper line, an optical line, a wireless communication channel, an infrared communication link, or other communication path. A connection between two devices, such as device 805 and device 810, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 816 and 817, to transmit differential signals. As an example, when line 816 toggles from a low voltage level to a high voltage level, i.e. a rising edge, line 817 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Note that the apparatus, methods, and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 9:
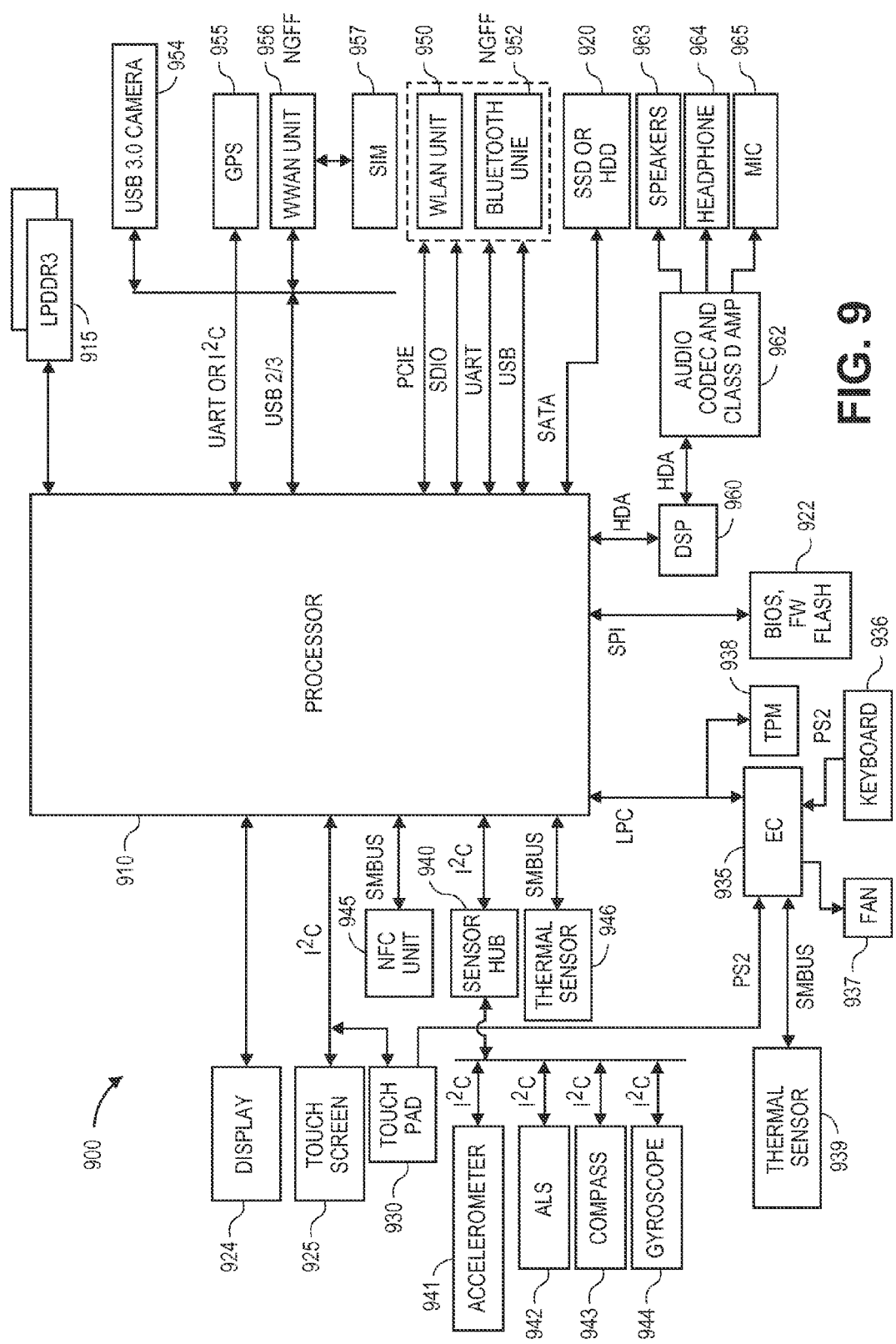
FIG. 9 illustrates an embodiment of a block diagram for a computing system.

Referring now to FIG. 9, a block diagram of components present in a computer system in accordance with an embodiment of the present invention is illustrated. As shown in FIG. 9, system 900 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 9 is intended to show a high level view of many components of the computer system. However, it is to be understood that some of the components shown may be omitted, additional components may be present, and different arrangement of the components shown may occur in other implementations. As a result, the invention described above may be implemented in any portion of one or more of the interconnects illustrated or described below.

As seen in FIG. 9, a processor 910, in one embodiment, includes a microprocessor, multi-core processor, multi-threaded processor, an ultra low voltage processor, an embedded processor, or other known processing element. In the illustrated implementation, processor 910 acts as a main processing unit and central hub for communication with many of the various components of the system 900. As one example, processor 900 is implemented as a system on a chip (SoC). As a specific illustrative example, processor 910 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor 910 in one implementation will be discussed further below to provide an illustrative example.

Processor 910, in one embodiment, communicates with a system memory 915. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, Mini-DIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 920 may also couple to processor 910. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 9, a flash device 922 may be coupled to processor 910, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 900. Specifically shown in the embodiment of FIG. 9 is a display 924 which may be a high definition LCD or LED panel configured within a lid portion of the chassis. This display panel may also provide for a touch screen 925, e.g., adapted externally over the display panel such that via a user's interaction with this touch screen, user inputs can be provided to the system to enable desired operations, e.g., with regard to the display of information, accessing of information and so forth. In one embodiment, display 924 may be coupled to processor 910 via a display interconnect that can be implemented as a high performance graphics interconnect. Touch screen 925 may be coupled to processor 910 via another interconnect, which in an embodiment can be an $I^2C$ interconnect. As further shown in FIG. 9, in addition to touch screen 925, user input by way of touch can also occur via a touch pad 930 which may be configured within the chassis and may also be coupled to the same $I^2C$ interconnect as touch screen 925.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920× 1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 910 in different manners. Certain inertial and environmental sensors may couple to processor 910 through a sensor hub 940, e.g., via an I$^2$C interconnect. In the embodiment shown in FIG. 9, these sensors may include an accelerometer 941, an ambient light sensor (ALS) 942, a compass 943 and a gyroscope 944. Other environmental sensors may include one or more thermal sensors 946 which in some embodiments couple to processor 910 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 9, various peripheral devices may couple to processor 910 via a low pin count (LPC) interconnect. In the embodiment shown, various components can be coupled through an embedded controller 935. Such components can include a keyboard 936 (e.g., coupled via a PS2 interface), a fan 937, and a thermal sensor 939. In some embodiments, touch pad 930 may also couple to EC 935 via a PS2 interface. In addition, a security processor such as a trusted platform module (TPM) 938 in accordance with the Trusted Computing Group (TCG) TPM Specification Version 1.2, dated Oct. 2, 2003, may also couple to processor 910 via this LPC interconnect. However, understand the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 900 can communicate with external devices in a variety of manners, including wirelessly. In the embodiment shown in FIG. 9, various wireless modules, each of which can correspond to a radio configured for a particular wireless communication protocol, are present. One manner for wireless communication in a short range such as a near field may be via a near field communication (NFC) unit 945 which may communicate, in one embodiment with processor 910 via an SMBus. Note that via this NFC unit 945, devices in close proximity to each other can communicate. For example, a user can enable system 900 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 9, additional wireless units can include other short range wireless engines including a WLAN unit 950 and a Bluetooth unit 952. Using WLAN unit 950, Wi-Fi™ communications in accordance with a given Institute of Electrical and Electronics Engineers (IEEE) 802.11 standard can be realized, while via Bluetooth unit 952, short range communications via a Bluetooth protocol can occur. These units may communicate with processor 910 via, e.g., a USB link or a universal asynchronous receiver transmitter (UART) link. Or these units may couple to processor 910 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 956 which in turn may couple to a subscriber identity module (SIM) 957. In addition, to enable receipt and use of location information, a GPS module 955 may also be present. Note that in the embodiment shown in FIG. 9, WWAN unit 956 and an integrated capture device such as a camera module 954 may communicate via a given USB protocol such as a USB 2.0 or 3.0 link, or a UART or I²C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 960, which may couple to processor 910 via a high definition audio (HDA) link. Similarly, DSP 960 may communicate with an integrated coder/decoder (CODEC) and amplifier 962 that in turn may couple to output speakers 963 which may be implemented within the chassis. Similarly, amplifier and CODEC 962 can be coupled to receive audio inputs from a microphone 965 which in an embodiment can be implemented via dual array microphones (such as a digital microphone array) to provide for high quality audio inputs to enable voice-activated control of various operations within the system. Note also that audio outputs can be provided from amplifier/CODEC 962 to a headphone jack 964. Although shown with these particular components in the embodiment of FIG. 9, understand the scope of the present invention is not limited in this regard.

Figure 10:
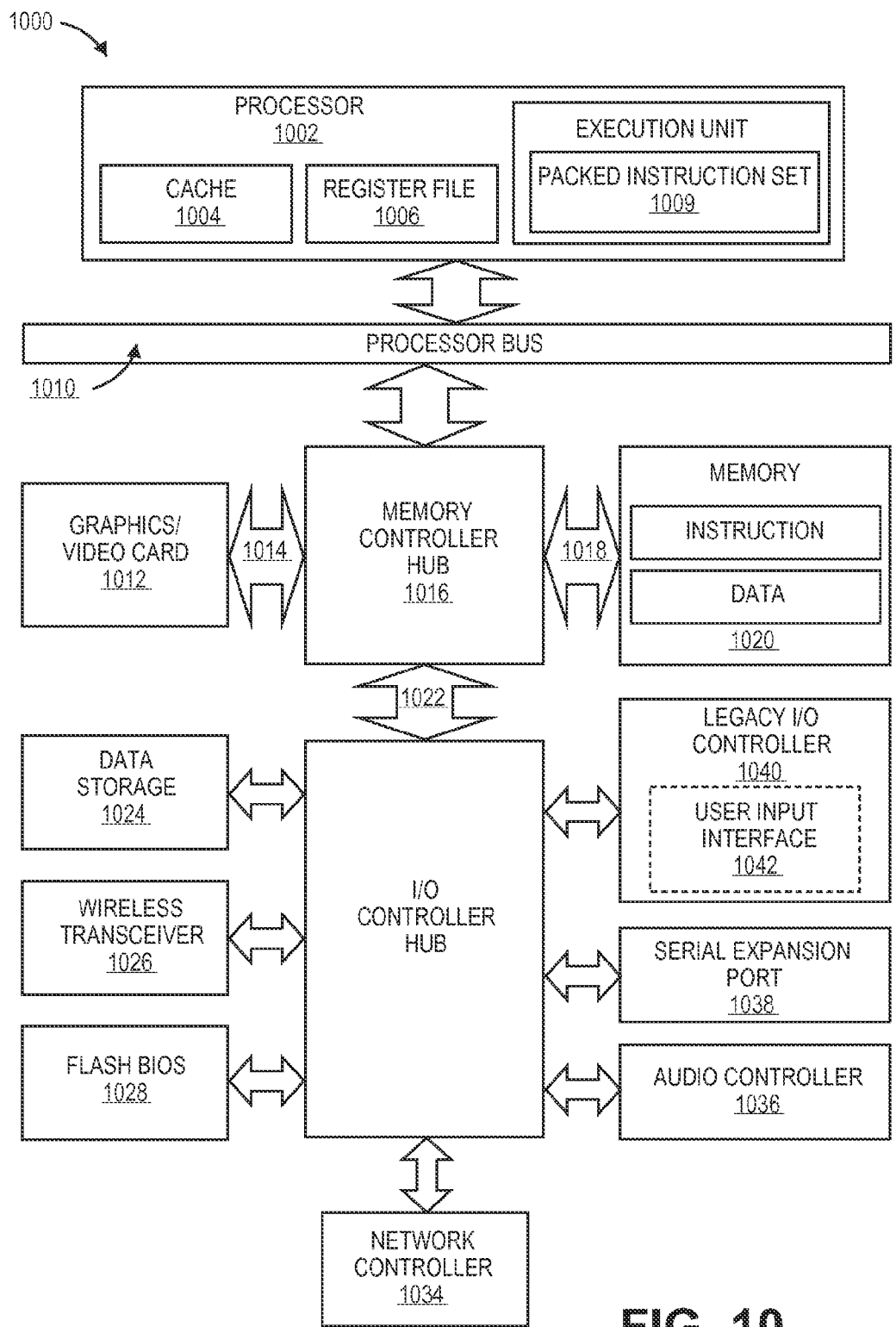
FIG. 10 illustrates another embodiment of a block for a computing system.

Turning to FIG. 10, a block diagram of an exemplary computer system formed with a processor that includes execution units to execute an instruction, where one or more of the interconnects implement one or more features in accordance with one embodiment of the present invention is illustrated. System 1000 includes a component, such as a processor 1002 to employ execution units including logic to perform algorithms for process data, in accordance with the present invention, such as in the embodiment described herein. System 1000 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 1000 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1002 includes one or more execution units 1008 to implement an algorithm that is to perform at least one instruction. One embodiment may be described in the context of a single processor desktop or server system, but alternative embodiments may be included in a multiprocessor system. System 1000 is an example of a 'hub' system architecture. The computer system 1000 includes a processor 1002 to process data signals. The processor 1002, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1002 is coupled to a processor bus 1010 that transmits data signals between the processor 1002 and other components in the system 1000. The elements of system 1000 (e.g. graphics accelerator 1012, memory controller hub 1016, memory 1020, I/O controller hub 1024, wireless transceiver 1026, Flash BIOS 1028, Network controller 1034, Audio controller 1036, Serial expansion port 1038, I/O controller 1040, etc.) perform their conventional functions that are well known to those familiar with the art.

In one embodiment, the processor 1002 includes a Level 1 (L1) internal cache memory 1004. Depending on the architecture, the processor 1002 may have a single internal cache or multiple levels of internal caches. Other embodiments include a combination of both internal and external caches depending on the particular implementation and needs. Register file 1006 is to store different types of data in various registers including integer registers, floating point registers, vector registers, banked registers, shadow registers, checkpoint registers, status registers, and instruction pointer register.

Execution unit 1008, including logic to perform integer and floating point operations, also resides in the processor 1002. The processor 1002, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1002. For one embodiment, execution unit 1008 includes logic to handle a packed instruction set 1009. By including the packed instruction set 1009 in the instruction set of a general-purpose processor 1002, along with associated circuitry to execute the instructions, the operations used by many multimedia applications may be performed using packed data in a general-purpose processor 1002. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1008 may also be used in micro controllers, embedded processors, graphics devices, DSPs, and other types of logic circuits. System 1000 includes a memory 1020. Memory 1020 includes a dynamic random access memory (DRAM) device, a static random access memory (SRAM) device, flash memory device, or other memory device. Memory 1020 stores instructions and/or data represented by data signals that are to be executed by the processor 1002.

Note that any of the aforementioned features or aspects of the invention may be utilized on one or more interconnect illustrated in FIG. 10. For example, an on-die interconnect (ODI), which is not shown, for coupling internal units of processor 1002 implements one or more aspects of the invention described above. Or the invention is associated with a processor bus 1010 (e.g. Intel Quick Path Interconnect (QPI) or other known high performance computing interconnect), a high bandwidth memory path 1018 to memory 1020, a point-to-point link to graphics accelerator 1012 (e.g. a Peripheral Component Interconnect express (PCIe) compliant fabric), a controller hub interconnect 1022, an I/O or other interconnect (e.g. USB, PCI, PCIe) for coupling the other illustrated components. Some examples of such components include the audio controller 1036, firmware hub (flash BIOS) 1028, wireless transceiver 1026, data storage 1024, legacy I/O controller 1010 containing user input and keyboard interfaces 1042, a serial expansion port 1038 such as Universal Serial Bus (USB), and a network controller 1034. The data storage device 1024 can comprise a hard disk drive, a floppy disk drive, a CD-ROM device, a flash memory device, or other mass storage device.

Referring now to FIG. 11, shown is a block diagram of a second system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of a processor. In one embodiment, 1152 and 1154 are part of a serial, point-to-point coherent interconnect fabric, such as Intel's Quick Path Interconnect (QPI) architecture. As a result, the invention may be implemented within the QPI architecture.

While shown with only two processors 1170, 1180, it is to be understood that the scope of the present invention is not so limited. In other embodiments, one or more additional processors may be present in a given processor.

Processors 1170 and 1180 are shown including integrated memory controller units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 each exchange information with a chipset 1190 via individual P-P interfaces 1152, 1154 using point to point interface circuits 1176, 1194, 1186, 1198. Chipset 1190 also exchanges information with a high-performance graphics circuit 1138 via an interface circuit 1192 along a high-performance graphics interconnect 1139.

A shared cache (not shown) may be included in either processor or outside of both processors; yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present invention is not so limited.

As shown in FIG. 11, various I/O devices 1114 are coupled to first bus 1116, along with a bus bridge 1118 which couples first bus 1116 to a second bus 1120. In one embodiment, second bus 1120 includes a low pin count (LPC) bus. Various devices are coupled to second bus 1120 including, for example, a keyboard and/or mouse 1122, communication devices 1127 and a storage unit 1128 such as a disk drive or other mass storage device which often includes instructions/code and data 1130, in one embodiment. Further, an audio I/O 1124 is shown coupled to second bus 1120. Note that other architectures are possible, where the included components and interconnect architectures vary. For example, instead of the point-to-point architecture of FIG. 11, a system may implement a multi-drop bus or other such architecture.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:
1. An apparatus comprising:
a clocking module comprising first phase locked loop (PLL) circuitry and one or more drift buffers, wherein the clocking module is to:
receive a reference clock signal;
receive a control signal; and generate a plurality of clock signals from the reference clock signal, wherein a first one of the plurality of clock signals comprises a clock signal for an input/output interface comprising a physical layer and a logical layer, and a second one of the plurality of clock signals comprises a clock signal for a processor core.

2. The apparatus of claim 1, wherein the plurality of clock signals comprise at least a first clock signal and a second clock signal, the first clock signal is a first integer multiple of the reference clock signal, and the second clock signal is a second integer multiple of the reference clock signal.

3. The apparatus of claim 2, wherein the first clock signal is slower than the second clock signal.

4. The apparatus of claim 1, wherein the input/output interface is to support a link to couple to another device.

5. The apparatus of claim 4, wherein communication over the link is to be based on the clock signal for the input/output interface.

6. The apparatus of claim 5, wherein a second one of the plurality of clock signals is to be provided to the other device.

7. The apparatus of claim 6, wherein the communication over the link is to be further based on the second clock signal.

8. The apparatus of claim 1, wherein two of the plurality of clock signals comprise a clock pair.

9. The apparatus of claim 8, wherein the drift buffer is to control drift between the clock pair.

10. The apparatus of claim 1, wherein the drift buffer is to control drift involving one of: the reference clock signal and the plurality of clock signals.

11. The apparatus of claim 1, wherein the reference clock signal comprises a 100 MHz signal.

12. An apparatus comprising:
an interface comprising at least physical layer logic and link layer logic;
a processor core;
phase locked loop (PLL) circuitry to receive a reference clock signal and generate a plurality of clock signals from the reference clock signal; and
a plurality of drift buffers to provide the plurality of clock signals to a plurality of components of a device,
wherein the plurality of clock signals comprise a first clock signal for the interface and a second clock signal for the processor core, the first clock signal is a first integer multiple of the reference clock signal, the second clock signal is a second integer multiple of the reference clock signal, a particular one of the plurality of clock signals is to be synchronized with another clock signal generated from the reference clock signal for another device, and communication over a link between the first device and the second device is to be based on the particular clock signal.

13. A system comprising:
a first device;
a second device coupled to the first device by an interface, wherein the interface comprises a physical layer and a logical layer;
a clocking module comprising first phase locked loop (PLL) circuitry and one or more drift buffers, wherein the clocking module is to:
receive a reference clock signal;
receive a control signal; and
generate a plurality of clock signals from the reference clock signal,
wherein a first one of the plurality of clock signals comprises a clock signal for the interface and a second one of the plurality of clock signals comprises a clock signal for a processor core.

14. The system of claim 13, wherein at least one of the plurality of clock signals is to be used by the first device.

15. The system of claim 14, wherein at least another one of the plurality of clock signals is to be used by the second device.

16. The system of claim 13, wherein the clocking module is implemented at least in part on at least one of the first and second devices.

17. The system of claim 13, wherein the clocking module is implemented external to the first and second devices.

18. The system of claim 13, further comprising a reference clock generator to generate the reference clock signal.

* * * * *